United States Patent [19]

Levine et al.

[11] Patent Number: 5,719,434

[45] Date of Patent: Feb. 17, 1998

[54] ROTARY SWITCH

[75] Inventors: Mark Levine, Plainview; William T. Holmes, Jackson, both of N.J.

[73] Assignee: General Automotive Specialty Co., Inc., North Brunswick, N.J.

[21] Appl. No.: 295,289

[22] Filed: Aug. 24, 1994

Related U.S. Application Data

[62] Division of Ser. No. 104,214, Aug. 9, 1993.

[51] Int. Cl.[6] .................................................. H01L 23/495
[52] U.S. Cl. .................................... 257/666; 200/273
[58] Field of Search .......................... 257/666; 200/179, 200/24, 50.34, 61.19, 61.46, 273, 300, 274, 336

[56] References Cited

U.S. PATENT DOCUMENTS

| | | | |
|---|---|---|---|
| 4,032,730 | 6/1977 | Golbeck et al. | 200/11 DA |
| 4,041,259 | 8/1977 | Deming | 200/46 |
| 4,152,565 | 5/1979 | Rose | 200/291 |
| 4,737,608 | 4/1988 | Jones | 200/155 R |
| 5,381,037 | 1/1995 | Olivarez | 257/666 |

Primary Examiner—Sara W. Crane
Attorney, Agent, or Firm—Darby & Darby

[57] ABSTRACT

A rotary switch having a terminal base molded on a lead frame which includes internal contacts and external terminals, along with the connecting straps between them, all formed of a single metal part. Portions of the metal of the lead frame are selectively removed in order to create a variety of switch configurations. Different switch actuating rotors are provided which further allow creation of different switch modes (single throw, double throw, etc.). The rotor is also provided with detents in order to allow for retention and indexing of the switch positions. A ramp may be selectively installed into the rotor to eliminate unwanted detent positions without requiring a different rotor. One or more "floating" movable contact elements complete the circuits when the rotor allows a respective spring to force a floating movable element into contact with both of a corresponding pair of stationary contacts of the terminal base. A separately usable illuminated indicator module is mounted on a bushing surrounding the switch rotor and the knob of the switch transmits light passing from the indicator module to the front of the knob where it can be viewed. The module includes a light distributor which directs the light from a single lamp to several positions corresponding to the switch positions.

5 Claims, 10 Drawing Sheets

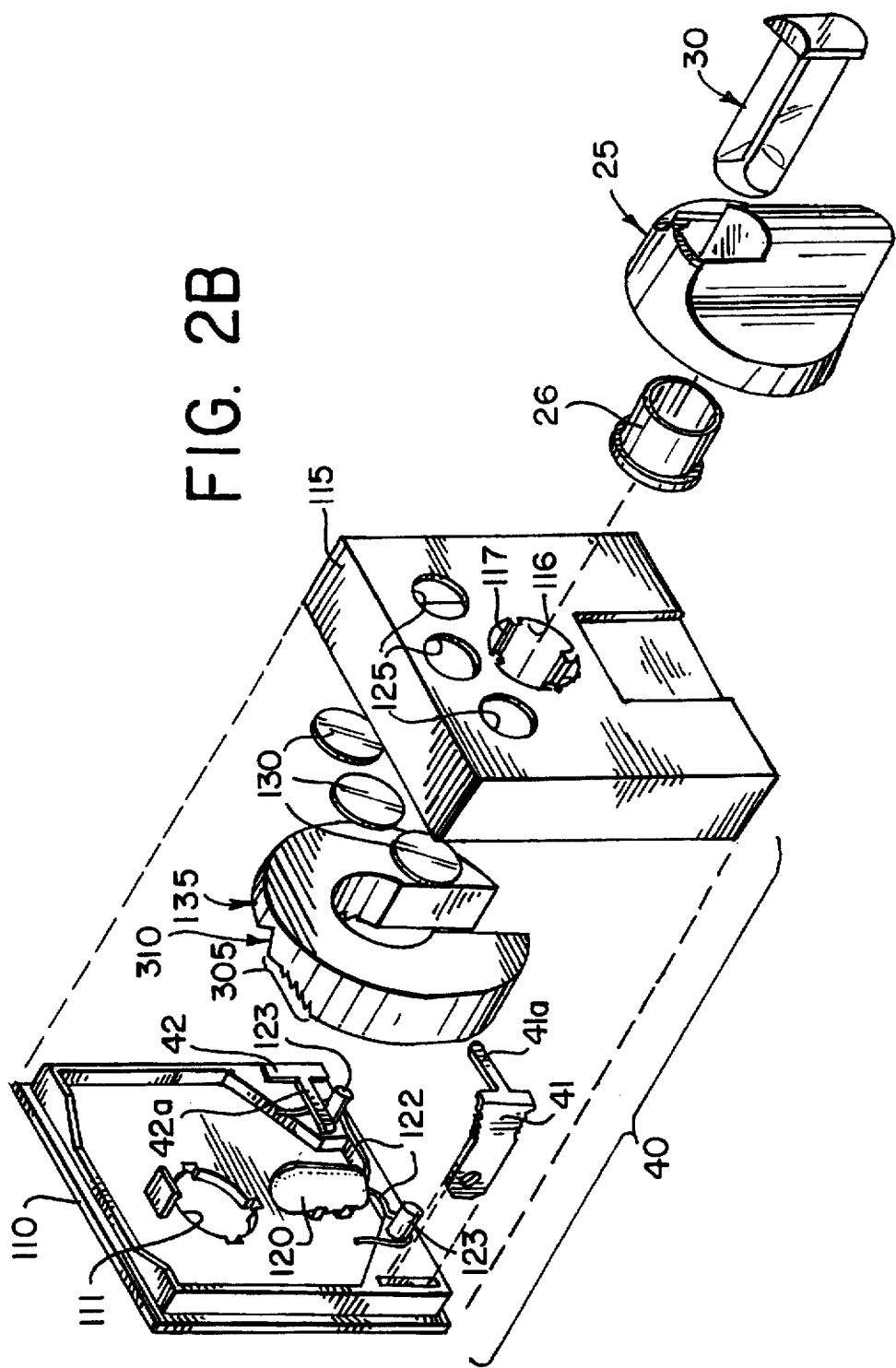

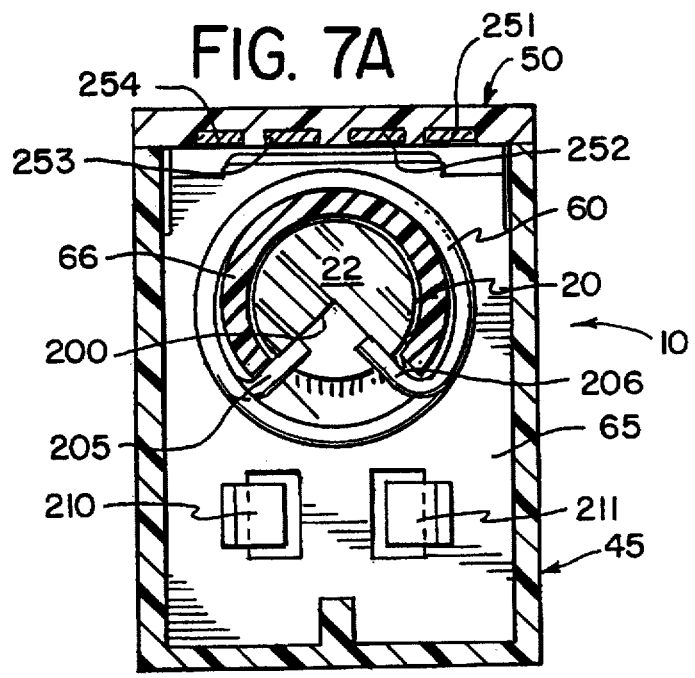
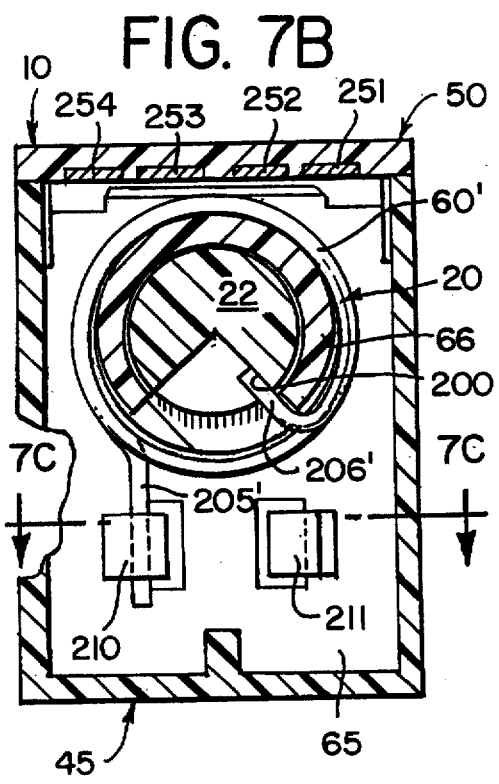
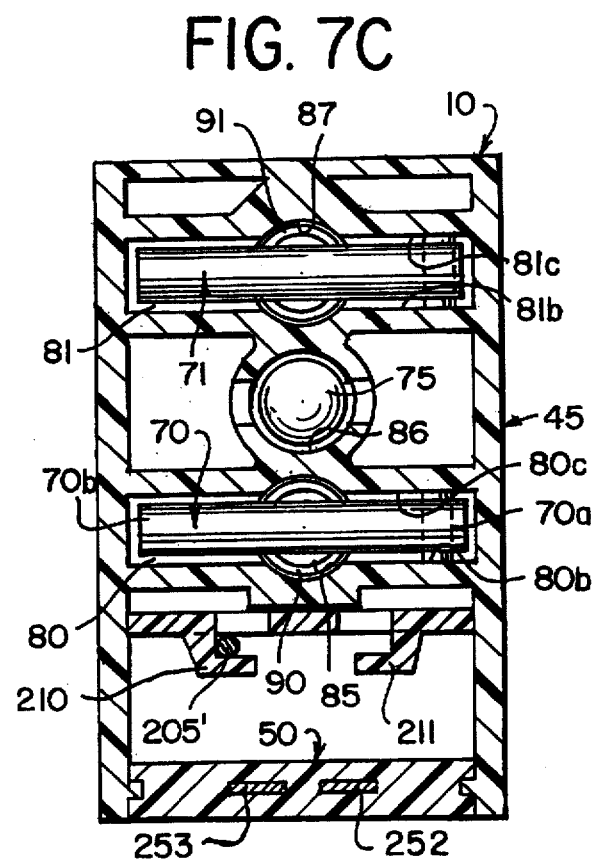

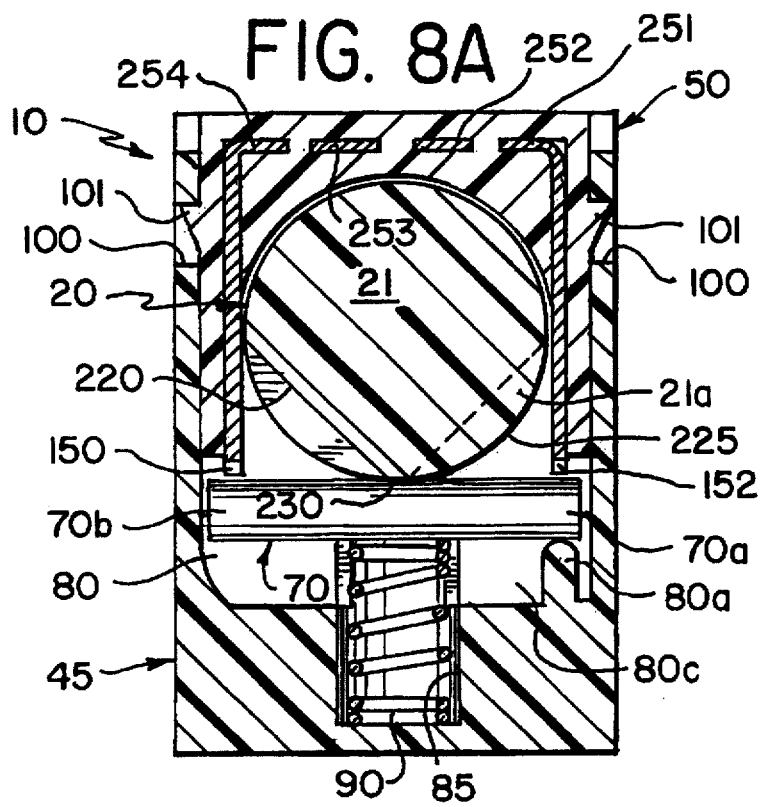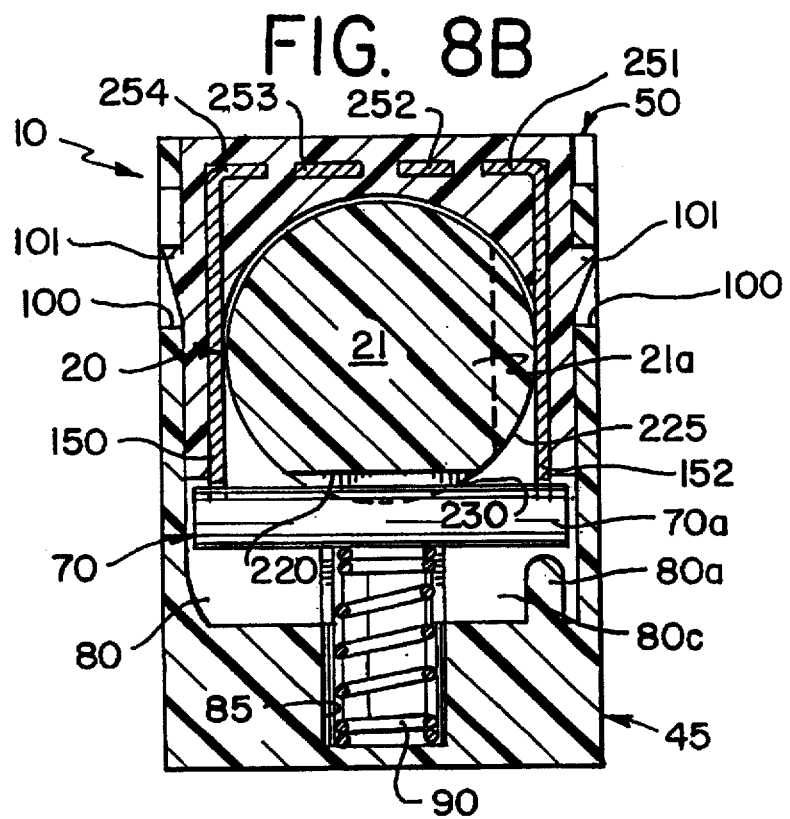

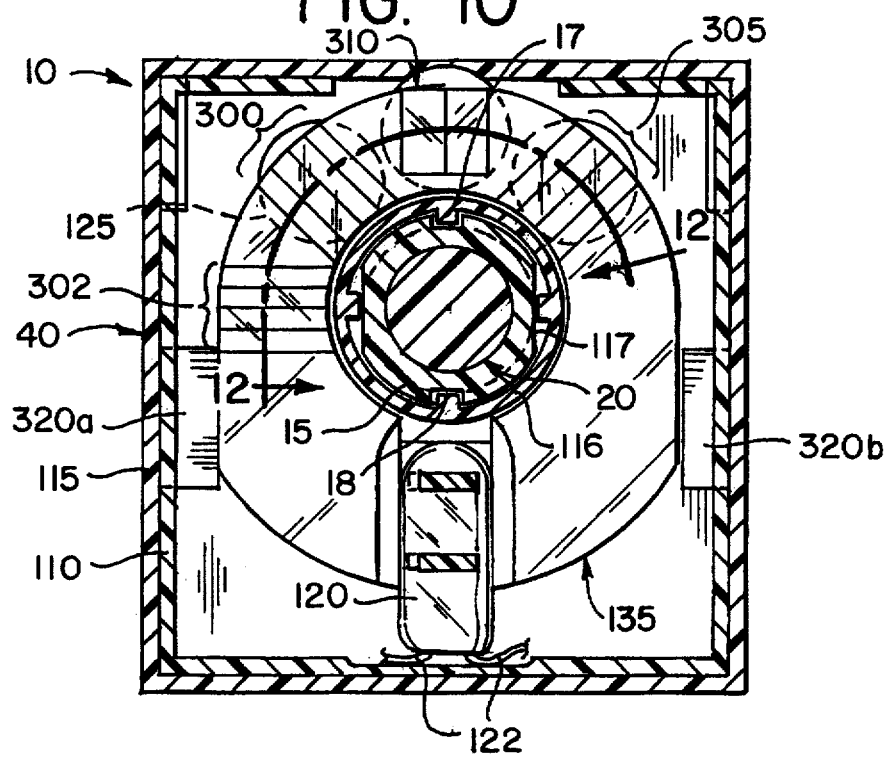
FIG. 10
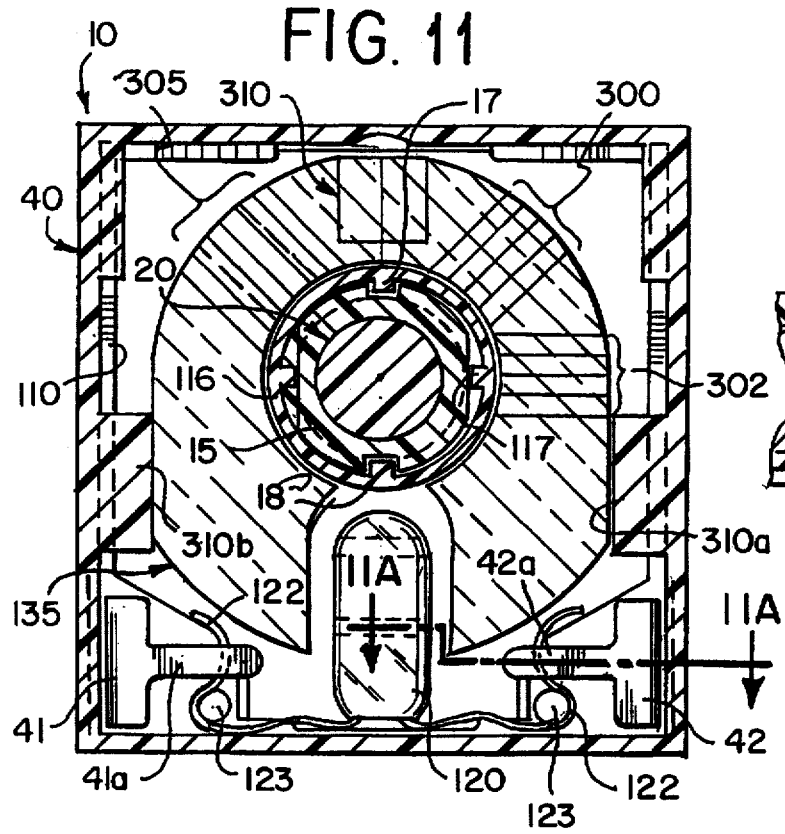
FIG. 11
FIG. 11A

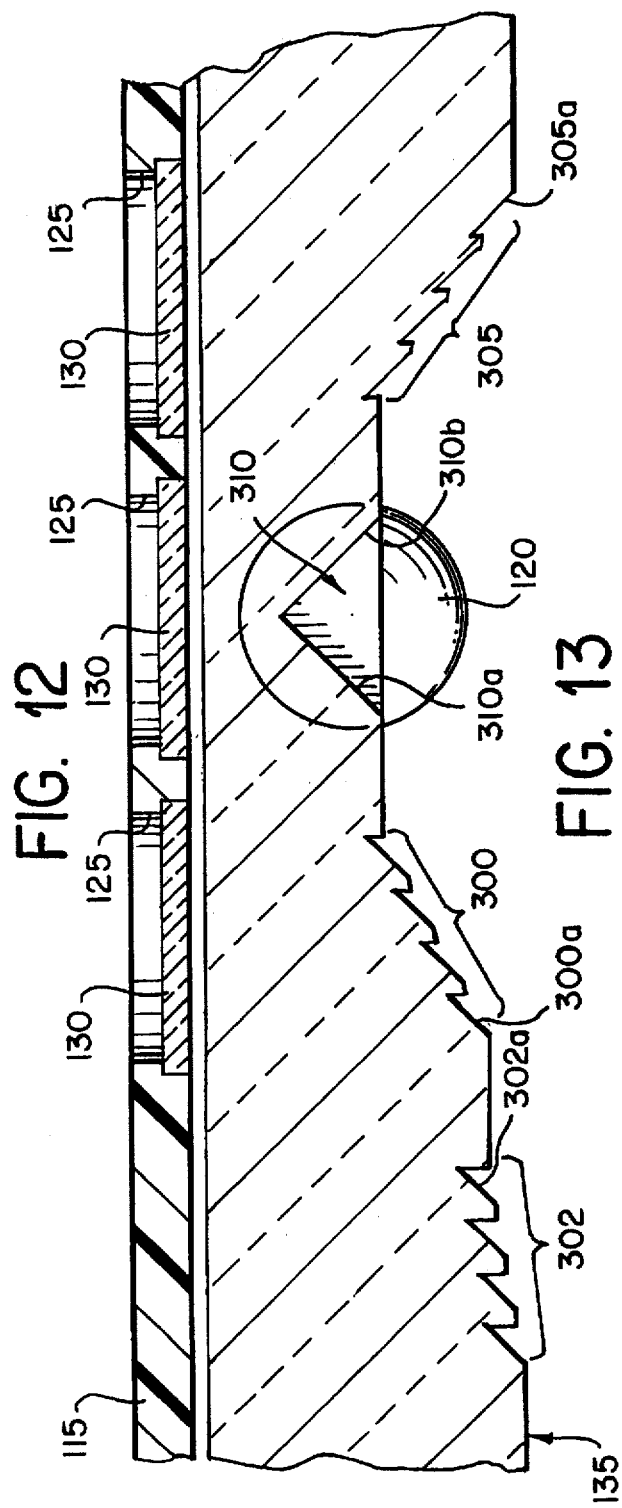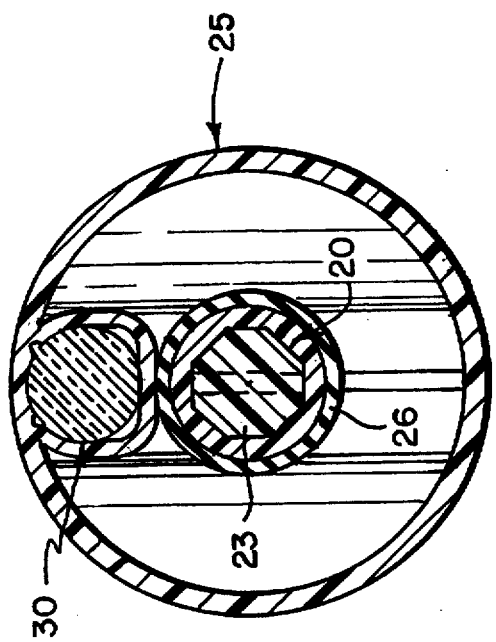

ROTARY SWITCH

This is a division of application Ser. No. 08/104,214, filed Aug. 9, 1993.

FIELD OF THE INVENTION

The present invention relates generally to electrical switches and in particular to a selectively configurable rotary switch.

BACKGROUND OF THE INVENTION

Switches are frequently used pieces of equipment which are mounted on control panels. It is desirable to have multiposition switches which provide to the user a positive tactile indication as well as illuminated visual indication of each switch position, particularly in complex control environments, where the switch may have more than two circuit conditions. It is also desirable to provide a versatile switch usable to realize a variety of different circuit configurations, by replacing a minimum of components. The present invention provides a modular switch design where the same switch components can be incorporated into several different types of switch, and where modular components of a single switch can be easily modified to create new types of switches.

The present invention also provides an improved illuminated indicator module, usable with many different types of rotary switch. The module provides a color-coded illuminated knob indication of the position of a switch rotor, which has particular utility in connection with a tactile indicator of switch positions, although usable with other switch configurations.

SUMMARY OF THE INVENTION

The rotary switch of the present invention incorporates a molded terminal base and has internal contacts and external terminals, along with the connecting straps between them, all formed of a single metal part, sometimes called a "lead frame". After molding of the lead frame into the terminal base, portions of the metal of the lead frame are selectively removed in order to create a variety of terminal base configurations so that several types of switches can be created. (e.g. single pole, double pole, etc.)

The switch of the present invention also utilizes any of several different actuating rotors which further allow creation of different switch actuation modes (single throw, double throw, etc.) in combination with the above described alterable terminal base. The rotor is also provided with detents for retention and indexing of the switch positions. A ramp-like projection may be selectively installed into rotor depressions to eliminate unwanted detent positions (such as in an "On-On" switch with no center "Off" position).

Another feature of the invention is one or more "floating" contact elements each of which completes or breaks a circuit at two points when a cam on the switch rotor allows a spring to force the floating element into contact with both of a pair of stationary contacts of the terminal base. The arrangement of parts permits readily attaining a momentary contact or a spring-return configuration for the switch, by minor substitution of parts.

Where it is desired to provide illumination to the switch actuating knob, a separate illumination module is mounted behind the switch panel. Apertures, corresponding to the various switch positions, are made in the panel to allow the light to pass through the panel. The knob is constructed of opaque material and has a transparent or translucent element which transmits light passing through the apertures to the front of the knob where it can be viewed. Separate terminals on the module allow the user to select whether the illumination is turned on by a separate switch or by action of the switch on which the module is installed. Provision of an illumination module separate from the switch provides for reduction in inventory since various switches can be stored separately from the module.

Colored filters may be mounted in the illumination module to provide desired colors of illumination. If different colors are used in a single module, the color of illumination of the knob will change as the switch is rotated from position to position. Alternatively, the light-transmitting element of the knob may be colored and the filters in the module eliminated if only a single color is required in all switch positions. While the illumination module may incorporate separate lamps for each switch position, the present invention includes an illumination distributor which directs the light from a single lamp to the several positions corresponding to the switch positions.

BRIEF DESCRIPTION OF THE DRAWINGS

The features and advantages of the present invention will be more fully understood from a reading of the following detailed description with reference being made to the drawings in which:

FIG. 2B is a exploded view of the illumination module of the switch of FIG. 1;

FIG. 7A is a transverse cross-sectional view of the switch of FIG. 3, taken along line 7A—7A;

FIG. 7B is a transverse cross-sectional elevational of a modification of the switch of FIG. 3, taken along lines 7B—7B;

FIG. 7C is a longitudinal cross-sectional view of the switch of FIG. 3, taken along line 7C—7C;

FIG. 8A is a transverse cross-sectional view of the switch of FIG. 3, taken along line 8A—8A;

FIG. 8B is a transverse cross-sectional view of a modification of the switch of FIG. 3, taken along line 8B—8B;

FIG. 10 is a transverse cross-sectional view of FIG. 3, taken along line 10—10;

FIG. 11 is a transverse cross-sectional view of the switch of FIG. 3, taken along line 11—11;

FIG. 11A is a cross-section of the illumination module of FIG. 11, taken along lines 11A—11A;

FIG. 12 is a cross-section of the illumination module of FIG. 10 taken along lines 12—12; and FIG. 13 is a cross-section of the knob of FIG. 3 taken along lines 13—13.

DETAILED DESCRIPTION OF THE PREFERRED EMBODIMENT

Figure 1:
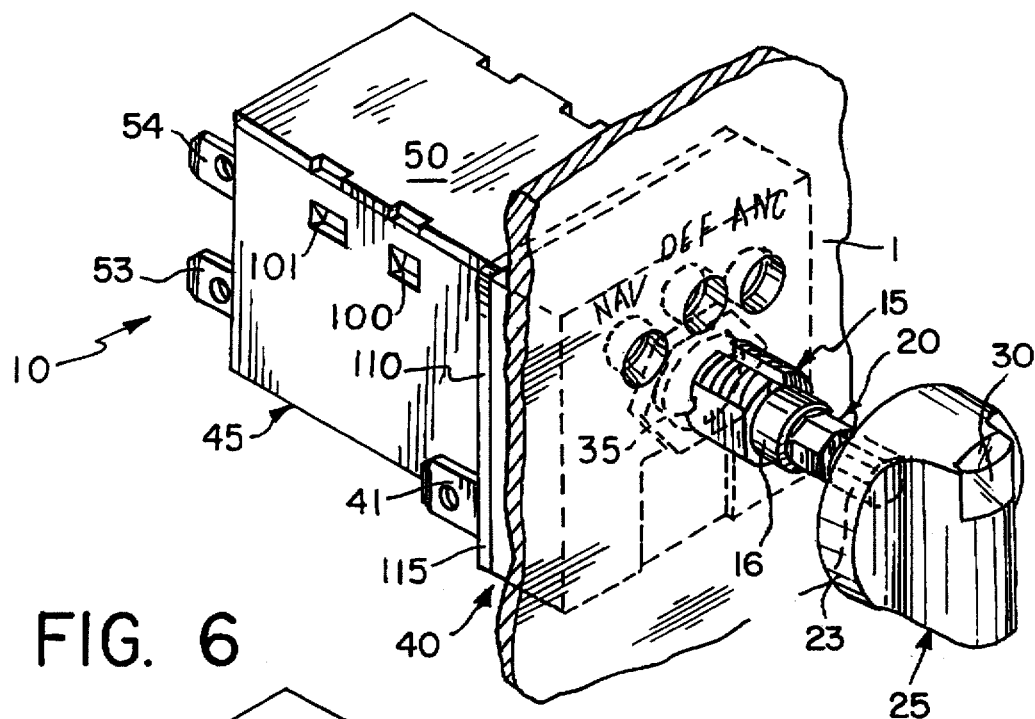
FIG. 1 is a perspective view of an assembled rotary switch according to the present invention.

With reference now to the figures, wherein like numerals indicate like elements throughout the several views, and in particular with reference to FIG. 1, an assembled rotary switch 10 according to the present invention is depicted. The switch 10 is shown mounted through a panel 1. The bushing 15 and rotor 20 of the switch 10 pass through panel 1, and nut 35 is used to secure the switch 10 to panel 1. The knob 25 of the switch 10 is mounted on rotor 20. The knob 25 has a transparent or translucent element 30 incorporated therein as part of the illumination system of the switch. The function of the illumination element 30 will be described in more detail in connection with FIGS. 2B and 10–13.

Also visible from the exterior of the switch 10 are the illumination module 40, the terminal base 50, and the housing 45. One of two electrical terminals 41 is shown exiting the illumination module 40 (the other illumination module terminal 42 is not shown in this Figure). A more detailed discussion of the illumination module 40 and its function will accompany the discussion of FIGS. 2B and 10–13. The housing 45 acts as a protective cover for the switch 10, and provides a mounting for the bushing 15 as well as support for other functional elements of the switch 10. Two external terminals 53, 54 (out of a total of four external terminals 51–54) are shown exiting the terminal base 50 at the rear of the switch 10. The structure of terminal base 50 will be discussed in connection with FIGS. 2A, 4–6.

Figure 2A:
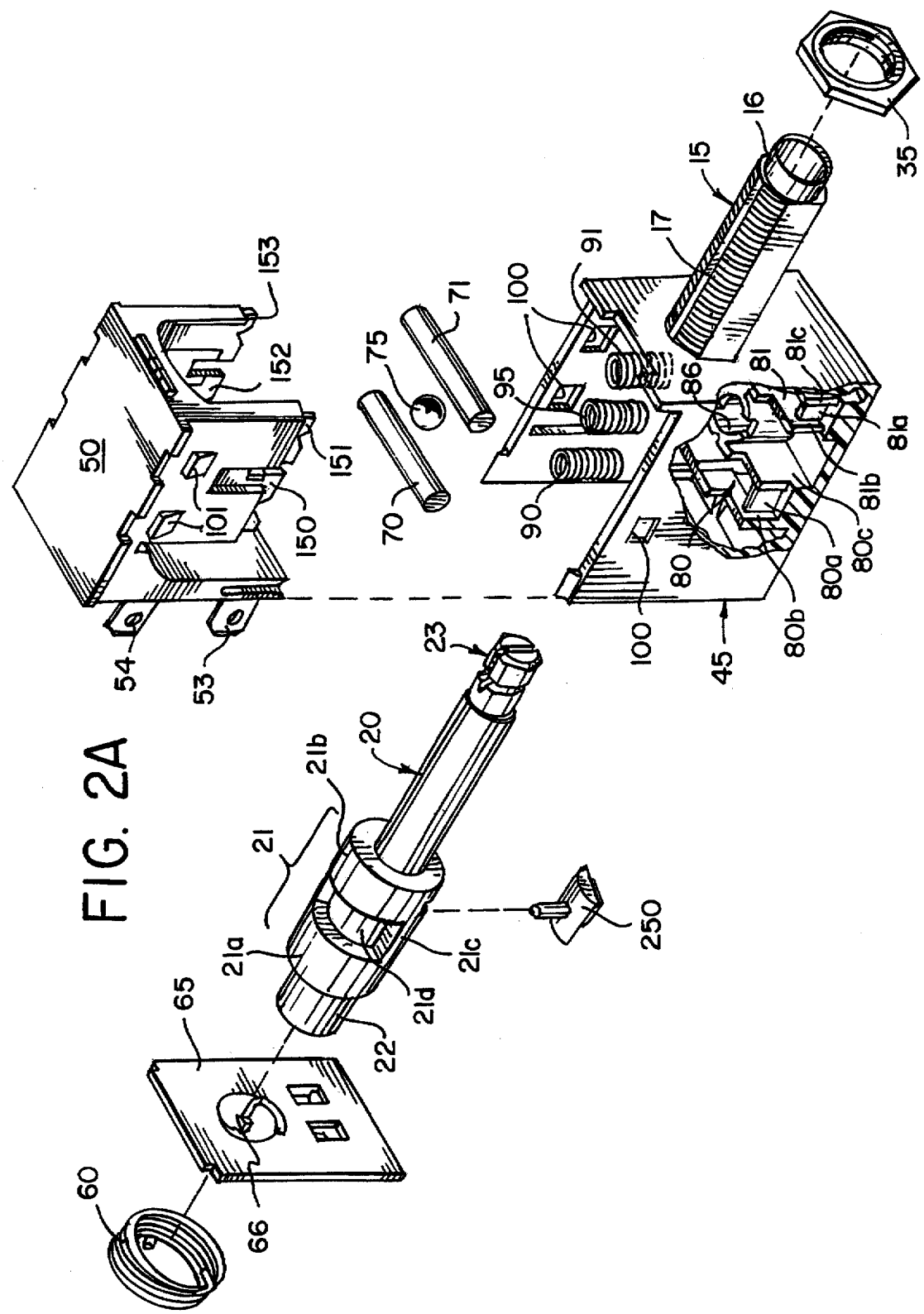
FIG. 2A is a exploded view of the rotary switch of FIG. 1.

The internal functional elements of switch 10 can be seen in greater detail in the exploded view of FIG. 2A. The rotor 20 has a central portion 21 attached near its distal end 22. The central portion 21 comprises two separate cams 21a and 21b (also illustrated in FIGS. 3 and 8A–8B) and a detent portion 21c (also illustrated in FIGS. 3 and 9A–B). The central portion 21 can be fabricated as an integral part of the rotor 20, or be fixedly attached to rotor 20 after the rotor 20 fabrication. In the preferred embodiment of the present invention, both the rotor 20 and the central portion 21 are made from a plastic material. The body of rotor 20 passes through the housing 45 and through a bore in bushing 15 such that the proximal end 23 of the rotor is able to mate with knob 25 as depicted in FIG. 1. The proximal end 23 of the rotor 20 is formed in an octagonal shape in order to mate with an octagonal recess in knob 25. Any polygonal shape (e.g. triangular, square) which will enable the knob 25 to suitably rotate the rotor 20, can be employed for the shape of the rotor proximal end 23 and the recess in knob 25.

The bushing 15 is either integrally formed as part of the housing 45, or is fixedly attached at a later time. The bushing is threaded for receipt of nut 35. Nut 35 allows for mounting of the switch 10 to panel 1 as depicted in FIG. 1. The bushing further has a reduced diameter, unthreaded neck 16 at its proximal end. The function of the neck 16 will be explained in connection with FIGS. 2B and 3. The bushing 15 also has two slots 17 and 18 in the top and bottom of the bushing 15 respectively (slot 18 is not shown in FIG. 2A). The purpose of the slots 17 and 18 will be discussed in connection with FIG. 2B.

A return spring 60 and spring plate 65 are mounted coaxially on the distal end 22 of the rotor 20. The spring plate 65 is mounted in recesses in the terminal base 50 and the housing 45. The structure and function of these two elements 60 and 65 will be more fully discussed in connection with FIGS. 7A and 7B.

The housing 45 contains mountings for two floating contact rods 70 and 71 and for a detent ball 75. The floating contact rods 70 and 71 are seated in cradles 80 and 81 respectively. Each cradle 80, 81 consists of one end support and two side walls. In the case of cradle 80, the end support is element 80a and the two side walls are 80b and 80c. In the OFF position, floating contact 70 will be supported in cradle 80 by end support 80a and spring 90. Similarly, in the case of cradle 81, the end support is element 81a and its two side walls are 81b and 81c. In the OFF position, floating contact 71 will be supported in cradle 81 by end support 81a and spring 91. The four side walls 80b–c and 81b–c prevent the floating contacts 70, 71 from moving laterally within the switch 10 when the switch 10 is an OFF position. The function of the floating contact springs 90 and 91 will explained in more detail in connection with FIGS. 8A and 8B.

Housing 45 also contains recesses for mounting three springs 90, 91 and 95. As previously discussed, springs 90 and 91 are used in connection with floating contacts 70 and 71 respectively. Spring 95 is used with detent ball 75. The detent ball spring 95 is seated in recess 86 in housing 45. Floating contact springs 90 and 91 are seated in recesses 85 and 87 respectively (recess 87 is not shown in FIG. 2A).

Housing 45 also contains four apertures 100 in its side walls. These four apertures 100 mate with four projections 101 in the terminal base 50 in order to secure the terminal base 50 in the housing 45 (two of the four projections 101 are not shown in FIG. 2A). The projections 101 are angled so as provide relatively easy assembly of the terminal base 50 and the housing 45 (i.e. by a "snap-in" assembly), but form an interlock with holes 100 to prevent unintentional separation of the two parts 45 and 50 once assembled.

The internal functional elements of the illumination module 40 can be seen in greater detail in the exploded view of FIG. 2B. The purpose of the illumination module 40 is to provide the user of the switch 10 with an illuminated indication of the switch position. The housing of the illumination module 40 is formed from a back piece 110 and a front piece 115 which fit together. Preferably, the front piece 115 and the back piece 110 are secured by ultrasonic welding with the internal components (described below) of the illumination module 40 contained between them.

Figure 3:
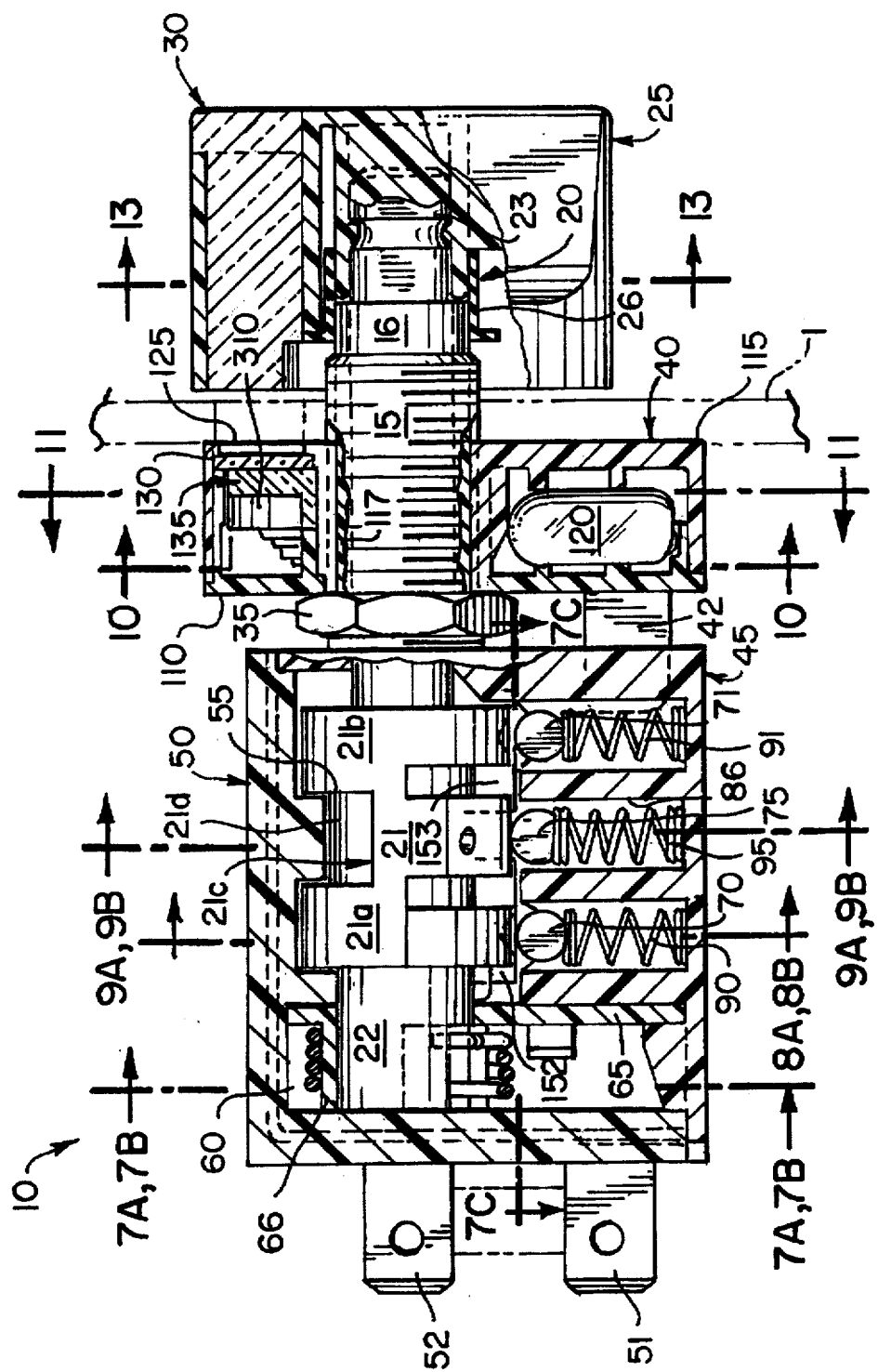
FIG. 3 is a longitudinal cross sectional view of the assembled switch.

The back piece 110 has a through hole 111, while the front piece has a corresponding through hole defined by illumination module bushing 116. The illumination module bushing 116 is used in mounting the illumination module 40 on the rotor bushing 15 (as seen in FIGS. 1 and 3). The bushing 116 has keys 117 projecting from its interior surface. Keys 117 are mated with the slots 17 and 18 (FIG. 2A) in rotor bushing 15 in order to properly align the illumination module 40 to the remainder of the switch 10 apparatus, particularly knob 25.

Back piece 110 of the illumination module 40 has mountings for a lamp 120 and its associated bare leads 122. The two lamp leads 122 are bent around two posts 123 formed on the back piece 110. In this manner, positive electrical contact to leads 122 is made when the two terminals 41 and 42 are placed in their operative position in the back piece 110. Leads 122 may be connected to terminals 41, 42 in any suitability way, such is soldering welding crimping or wrapping. The terminals 41 and 42 have a portion 41a, 42a contacting respective leads 122, and another portion extending through apertures in backpiece 110. As previously shown (in FIG. 1) terminals 41, 42 thereby extend out of the illumination module 40 to enable connection to an external power source (not shown) for supplying power to lamp 120.

The front piece 115 has three additional holes 125 extending therethrough. Mated into recessed lips (not shown) in holes 125, are three light filters 130. The purpose of filters 130 is to give the capability of providing different color indications for three separate switch positions of the preferred embodiment of the switch 10. In the preferred embodiment of the invention, each hole 125 is located at a 45 degree angle to the adjacent hole 125 (about the switch axis). This placement corresponds to the 45 degree angular displacement between the three switch positions of the preferred embodiment of the switch 10. The filters 130 can be manufactured either from a translucent or a colored or clear transparent material. An opaque component (not shown) of the same size as the filters 130 is also available to block any light from emerging from any of the holes 125 where light is not required or desired.

The final element of the illumination module is the illumination distributor 135. The distributor 135 is a transparent molded component, roughly horseshoe in shape. The distributor 135 channels the output of the lamp 120 (located in the open end of the horseshoe) to the location of holes 125 at 45-degree intervals and then reflects the light rays so that they emerge through these holes 125. The light output is directed perpendicular to the plane of the horseshoe shape distributor 135 so that it will emerge through panel 1 (FIG. 1) to which the switch 10 and illumination module 40 are mounted. In this way, a single lamp provides illuminations for all three openings 125.

The illumination module 40 is shown in FIG. 1 as being sandwiched between the housing 45 and the instrument panel 1. The switch 10 may be configured without including an illumination module 40. By providing a separate illumination module 40, any switch 10 may be utilized in either an illuminated or non-illuminated mode. Further, since the module 40 is separately powered via terminals 41 and 42, illumination can be flexibly controlled depending upon the needs or desires of the user. For example, module 40 and the switching elements of switch 10 can be interconnected so as to have the illumination activated by turning on the switch 10. On the other hand, the circuit can be designed so that illumination is controlled by an entirely separate switch (not shown) rather than by the switch 10 to which it is mounted.

In an alternative embodiment, the illumination module 40 may be configured with a separate lamp (not shown) for each illumination position. This may provide a higher level of illumination but at a sacrifice of cost and increased heating.

The illumination module 40 operates in conjunction with the actuating knob 25. Knob 25, when used with illumination, is fabricated from an opaque material but has a transparent or translucent element 30 set into it. The function of element 30 is to bring the light from module 40 to the front face of knob 25. In the preferred embodiment, this element 30 is fabricated of clear transparent material with the front face textured so as to diffuse the light and provide a broad angle of visibility to the user. Thus, for each setting of switch knob, its element 30 is positioned before a respective filter 130. When the filters are of differing colors, the front of knob 25 displays a respective color corresponding to the switch positions.

While the general shape of actuating knob 25 protects switch 10 from the entry of contaminants, a tubular elastomeric seal 26 is preferably additionally mounted on knob 25. The seal 26 is used to create a moisture resisting seal between knob 25 and the neck portion 16 (FIG. 2A) of bushing 15. This is of particular importance in marine applications on small boats where exposure to water is inevitable. Since actuating knob 25 is a separate component, its external shape can be altered without changing the basic switch 10. This allows providing unique designs, each differing from others, by appropriate tooling for each unique knob 25 without, in any way, requiring changes to the basic switch 10.

The switch may also be used without the illumination module. In such case, element 30 is made opaque and of a color contrasting with the knob to provide visual indication of switch position. Knob 25 may be manufactured as a homogeneous, single color design with an applique of an index mark (not shown) to visually indicate the angular position of knob 25. The knob 25 may also be designed with a separate colored element, contrasting with the knob color, inserted or molded into the knob to indicate position (not shown).

FIG. 3 is a cross-section of an assembled switch 10, showing the major functional elements of switch 10. The separate structures and functions of the different parts of switch 10 will each be discussed in detail in the drawings which follow. As shown in FIG. 3, switch 10 is in an entirely OFF position. The two floating contacts 70, 71 in this Figure are not in electrical contact with any of the stationary contacts 150–153 of terminal base 50 (stationary contacts 150–151 are not shown in this Figure). In the OFF position, cams 21a and 21b respectively prevent springs 90 and 91 from causing the floating contacts 70, 71 to make electrical connection to the stationary contacts 150–153. The switching function is accomplished when a floating contact 70 or 71 is permitted to electrically connect together two of the internal stationary contacts 150–153. Switching on occurs when the appropriate cam 21a, 21b is rotated to allow a spring 90 or 91 to force the respective floating contact 70 or 71 to press upon a pair of the stationary contacts 150–153. The circuit is broken when the procedure is reversed. Since there are two circuits available in the switch 10 (to be described in more detail below), switch 10 is provided with two separate cams 21a and 21b. Each of the cams 21a, 21b may be configured to provide an open or closed circuit at each switch position. In an embodiment of switch 10 where the switch provides only a one-circuit operation, only one floating contact 70 or 71 and spring 90 or 91 is installed and only one of the cams 21a or 21b is active.

Rotation of knob 25 will cause rotation of cams 21a and 21b which will allow at least one of the floating contacts 70 and/or 71 to be forced into electrical connection with a respective pair of the stationary contacts 150–153 by the springs 90 and/or 91. Once electrical connection is made between the floating contact 70 and/or 71 and the stationary contacts 150–153, some combination of the external terminals 51–54 will be electrically connected. How a switch actually operates electrically is a function of the configuration of the terminal base 50.

Figure 4:
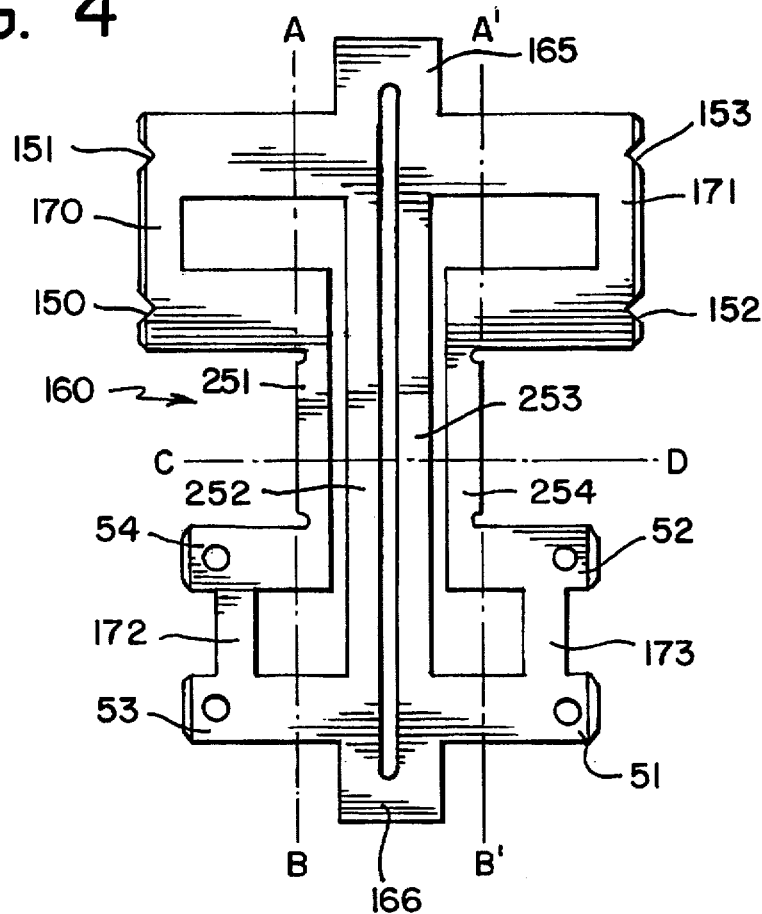
FIG. 4 is a plan view of a blank of the lead frame.

FIG. 4 depicts a blank lead frame 160 for the terminal base 50. The lead frame 160 is stamped from conductive metal sheet. Lead frame 160 includes four elements which will become the external terminals 51–54 of the switch 10. The lead frame 160 also includes four elements which will become the internal stationary contacts 150–153 of the switch 10. As fabricated, the lead frame 160 includes two connecting straps 165 and 166 which are removed after the lead frame 160 has been incorporated into the terminal base 50. The blank lead frame 160 also includes four connecting straps 170–173. Strap 170 connects elements 150 and 151. Strap 171 connects elements 152 and 153. Strap 172 connects 53 and 54. Strap 173 connects terminals 51 and 52. One or more of these straps may or may not be removed depending upon the function of the particular switch 10 being fabricated. Again, depending upon the function of the switch 10 desired, one or two of the external terminals 51–54 may also be removed.

While all the elements 150–153 and terminals 51–54 are electrically connected as initially fabricated, removal of all six connecting straps 165, 166, 170–173 will result in each of the four external terminals 51–54 being connected uniquely to a respective one of the four internal stationary contacts 151–153. For example, with all connecting straps 165–173 removed, stationary contact 151 will be connected only to external terminal 53, contact 150 will be connected to terminal 54, contact 152 will be connected to terminal 52 and contact 153 will be connected to terminal 51. The function of the switch in this case, will be to connect terminals 51 and 53 together when floating contact 71 (FIGS. 2A or 3) makes the connection between stationary contacts 151 and 153. Similarly, terminal 52 will be connected to terminal 54 after floating contact 70 (FIGS. 2A or 3) makes the connection between stationary contacts 150 and 152. This configuration allows for two separate circuits to be switched, as by two separate but ganged single-pole switches.

One of the advantageous features of the present invention is that its design allows simple customization of the switch function by selectively removing the connecting straps 170–173. For example, if it is desired to have external terminal 51 feed power to both external terminals 53 and 54, straps 165, 166 and 171–173 will be removed, leaving strap 170 in place. In this manner, when the floating contact 71 (FIGS. 2A or 3) makes the connection between stationary contacts 153 and 151, power will flow from terminal 51, through contact 153, through floating contact 71, through contact 151 directly to external terminal 53, and through connecting strap 170 to terminal 54. In this configuration, terminal 52 would be removed, and contact 70 and spring 90 would be omitted, resulting in a cost reduction.

By removing other combinations of straps, other switching configurations may be provided. If only a single circuit is desired, a pair of the external terminals can be removed (e.g. terminals 51 and 53 or terminals 54 and 52). In this configuration, only a single floating contact, 70 or 71 is required.

In another configuration, straps 170, 172 and 173, and terminal 52 are removed. In this way, loads fed from terminal 51 to terminals 53 and 54 are isolated from one another. With elements 70, 71, 90 and 91 in place, in one switch position power from terminal 51 is connected only to terminal 53. In another switch position, power may be fed to both terminals 53 and 54, or only to 54, depending on rotor cam configuration.

Figure 5:
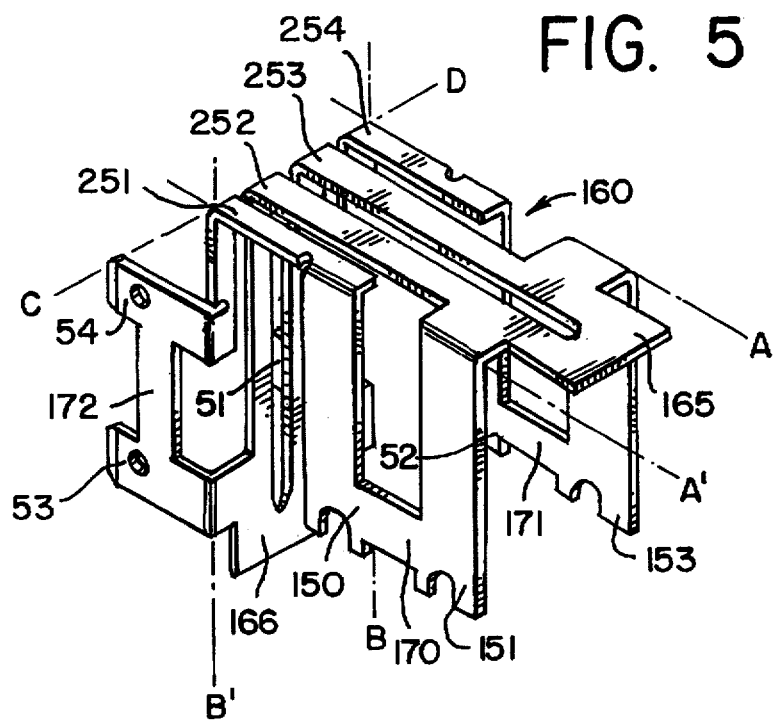
FIG. 5 shows a perspective view of the lead frame of FIG. 4 after it has been appropriately bent for incorporation in the switch.

FIG. 5 depicts the lead frame 160 after the contacts 150–153 and terminals 51–54 have been bent into their operational configurations. FIG. 4 illustrates the fold lines A–B, A'–B', and C–D along which the bending is made. The two pairs of external terminals 53–54 and 51–52 are bent along lines A–B and A'–B' respectively at a 90 degree angle to the plane of the blank lead frame 160 (i.e. into the plane of the paper). Similarly, the two pairs of stationary contacts 150–151 and 152–153 are bent along line A–B and A'–B', respectively at a 90 degree angle to the plane of blank lead frame in the opposite direction (i.e. out of the plane of the paper). At this point in the formation of the lead frame 160, the sets of terminals 51–52 and contacts 152–153 will be coplanar, but will be extending in opposite directions. Similarly the sets of terminals 53–54 and contacts 150–151 will be coplanar, but will be extending in opposite directions.

Figure 6:
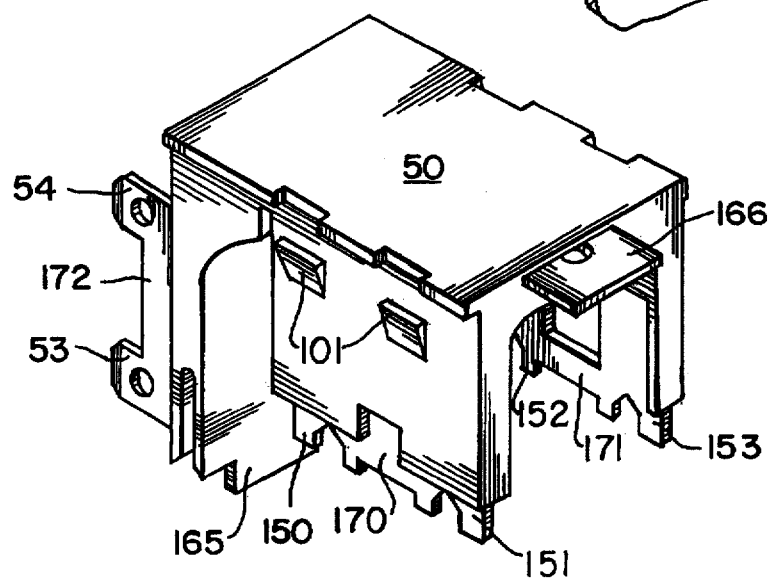
FIG. 6 shows a perspective view of the terminal base of the switch including the bent lead frame of FIG. 5 molded into a plastic base.

To complete the forming operation, the portions of the lead frame containing the external terminals 51–54 and the stationary contacts 150–153 are bent into 90 degree perpendicular planes along fold line C–D. The resultant structure is shown in FIG. 5. After the bending operation has been completed, the lead frame 160 is encapsulated within injection molded plastic in order to form the terminal base 50 with the terminals extending outwardly of the plastic as depicted in FIG. 6.

FIGS. 7A–B illustrate the structure of the return spring 60 and spring plate 65. These elements 60, 65 provide an optional "momentary" contact operation for switch 10. The purpose of the spring 60 and spring plate 65 is to bias the rotor 20 of the switch toward a normal, "at rest" switch position. Bushing 66 of the spring plate 65 supports the torsion string are provides a bearing for the rotor. This assembly (60 and 65) accommodates two forms of torsion springs depending upon whether the desired spring return is bidirectional (biased toward a normal position from both clockwise and counter-clockwise displacement) or monodirectional (biased toward the normal position from only one displacement direction).

As seen in FIG. 7A, helical spring 60 is mounted on a collar or hollow cylindrical boss 66 of the spring plate 65 (collar 66 is also shown in FIG. 2A). The distal end 22 of the rotor 20 extends through the bore of the collar 66. A "V" shaped recess 200 has been notched into very end of the distal end 22 of the rotor 20. The section of collar 66 in the vicinity of the notch 200 is also cut away to match the rotor "V" section 200. The spring 60 functions by acting against the interior surface of the "V" notch 200 in the distal portion 22 of rotor 20. One of two forms of springs is used, depending on whether the momentary contact function operates mono- or bidirectionally. The embodiment depicted in FIG. 7A, illustrates a bidirectional or dual return switch. In this embodiment, the spring 60 has two legs 205, 206 formed at the ends of spring 60. The legs 205, 206 engage the interior surfaces of both the cut-away section of the collar 66 and the "V" shaped recess 200 of the distal portion 22 of the rotor 20. Rotation of the rotor distal portion 22 in either a clockwise or counter-clockwise direction will result in the "winding up" of the spring 60, to store tension in. When the rotational force on the distal portion 22 is released, the spring 60 will resiliently unwind, and return the distal portion 22 to its original position. Of course, as is seen in FIG. 2A, since the distal portion 22 is part of the rotor 20, any action on the distal portion 22 will also act on the rotor 20.

FIG. 7B illustrates a unidirectional embodiment 60' of the torsion spring and spring plate assembly which results in spring return from only one direction. In order to accomplish the single direction return, one spring leg 206' (in FIG. 7B) is formed to engage the "V" notch 200 of the rotor distal end 22. The other leg 205' of the spring 60' is formed outward to bear against a spring leg retainer 210 formed in the spring plate 65. In this embodiment, only counter clockwise rotation of the distal portion 22 as viewed from the front of the switch will cause the spring 60' to wind. If the rotor distal portion 22 of the embodiment depicted in FIG. 7B is rotated in the clockwise direction, there is no spring leg for the rotor to bear upon, and the rotor moves freely with spring leg 206' in notch 200. The spring 60' is accordingly not wound, and therefore the rotor distal portion 22 will not be forced back to the central position.

Although not shown in the drawings, in order to provide spring return in the clockwise direction, spring leg 205' would be formed to engage "V" notch 200 in the rotor distal portion 22, as in FIG. 7A, while spring leg 206' would be formed to bear on the spring leg retainer 211.

FIG. 7C is a cross-section view of the switch 10 taken along line 7C—7C of FIG. 3 and illustrates the floating contact rods 70, 71 and the detent ball 75. As seen in this Figure, the two floating contacts 70, 71 rest in their respective cradles 80, 81 and are respectively supported by springs 90 and 91 and end supports 80a and 81a. Springs 90 and 91 are respectively placed in circular recesses 85 and 87 in the housing 45.

FIGS. 8A and 8B are helpful in illustrating the operation of cam members 21a and 21b. Although only cam 21a is shown, the following description equally applies to cam 21b. In the position of cam 21a depicted in FIG. 8A, floating contact 70 is not electrically connecting stationary contacts 150 and 152, and therefore this portion of switch 10 is in the "OFF" position. The periphery of cam 21a is defined by a partially circular surface 225 and a flat surface 220. An edge 230 is formed where the two surfaces 220 and 225 intersect. Spring 90 causes an upward force on the floating contact 70 such that contact rod 70 is forced into abutment with cam 21a. In the position depicted in FIG. 8A, the circular portion of the cam 21a holds the floating contact rod 70 down, and out of electrical connection with stationary contacts 150 and 152.

As the rotor 20 is rotated in a clockwise direction, viewed from the front (knob) end, edge 230 of cam 21a will accordingly rotate in the same direction. During the rotation, edge 230 will travel in both horizontal and vertical directions. As the edge travels in the vertical direction, the force of spring 90 will cause the floating contact 70 to remain in abutment with cam edge 230 so that the contact 70 will also begin to travel in the vertical direction. At some point during the angular shaft rotation, the cam edge will travel vertically above the bottoms of the stationary contacts 150 and 152. At this point, the spring 90 will force the floating contact 70 into abutment with stationary contacts 150 and 152 thereby making an electrical connection. As can be seen in FIG. 8B, after a full 45 degrees of angular rotation, floating contact 70 has made the electrical connection between stationary contacts 150 and 152. The flat portion 220 of cam 21a is now facing, but is spaced, from floating contact 70 and the cam edge 230 is no longer in abutment with the contact 70. In this position, spring 90 is exerting a vertical force on the contact 70 such that the contact 70 is fully abutting stationary contacts 150, 152, and the switch is in the "ON" position.

In performing the reverse operation, changing the switch 10 from an "On" position to an "Off" position, one end 70a of the floating contact 70 is restricted as to how far it can travel by end support 80a. Abutment with end support 80a causes the opposite end 70b of floating contact 70 to separate more from its respective stationary contact 152. This geometry assures that contact end 70b will move by a greater distance than the actual lift of the cam, thus providing an adequate separation of the conductive elements during shaft rotation, so that the potential for undesirable arcing while going to or in the "Off" position is reduced.

The angular orientation of cams 21a and 21b, with respect to each other, will determine the switching operation occurring in each of the switch's operational positions. In the configuration first described, the flat portions of the cams are displaced angularly by 90°. In this way, fixed contracts 150, 152 will be shorted by movable contact 70 in one shaft position, at which fixed contacts 151, 153 are open circuited. By a 90° rotation of the shaft, the opposite occurs: contacts 150, 152 are open-circuited while contacts 151, 153 re connected. Where it is desired that external terminals 51, 53 or 52, 54 provide two independent circuits, the straps 170 to 173 will be removed. Alternatively, for a single pole/double throw arrangement, only one pair of straps, 170, 172 or 171, 173 will be removed. Generally, straps 172 and 173 are always removed.

For another example, if there are two separate circuits in the switch 10, and the center position of the switch 10 is desired to be a normally "OFF" position for both circuits, then both of the flat surfaces (230 for cam 21a and a corresponding flat surface for cam 21b) will be oriented such that when the rotor 20 is in the center switching position, cams 21a and 21b will hold down the floating contacts 70, 71 and each will be prevented from making electrical connection to its respective pair of stationary contacts 150, 152 or 151, 153. Similarly, the cams may be arranged to provide a center "ON" condition for both circuits by arranging them to be out of contact with movable contacts 70, 71 at the center shaft position.

As a further embodiment (not shown in the Figures) each of the cam members 21a or 21b may be configured with more than one flat surface (such as surface 230 in FIG. 8A). This will provide more than one switch position in which electrical connection can be made between the floating contacts 70, 71 and their respective pairs of stationary contacts 150, 152 and 151, 153. Thus, the orientation provided for cams 21a and 21b in conjunction with additional flat surfaces on one or more cams will enable the switch to perform a variety of functions, such as single throw, double throw, make-break, break-make, double break, double make connections, as desired by the designer of the switch 10.

These various functions and operating conditions are attainable merely by appropriate provision of the rotor configuration (possibly with removal of selected lead frame straps) without change in other components of the switch, thereby affording a simplified interchangeability of switch components to derive a variety of switch functions.

Figure 9A:
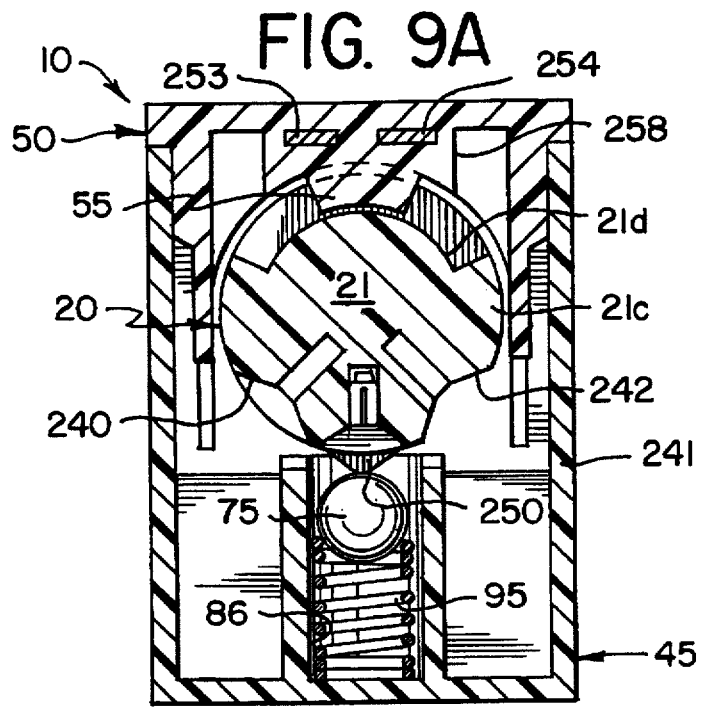
FIG. 9A is a transverse cross-sectional view of the switch of FIG. 3, taken along line 9A—9A.

FIG. 9A is a cross-section of the switch of FIG. 3 taken along line 9A—9A, and illustrates the function of the detent ball 75. The central portion 21 of rotor 20 contains a detent portion 21c (see FIG. 2A). In this illustrative embodiment, the detent portion 21c contains three separate depressions, or notches 240–242, which are axially in line with the detent ball 75 when the switch 10 is assembled. Furthermore, the depressions 240–242 are configured in rotation to cams 21a, 21b such that when the detent ball 75 seats in one of the detent depression 240–242, the electrical connections (between the stationary contacts 150–153 and the floating contacts 70–71) are either fully made or broken.

The upward force of spring 95 will cause detent ball 75 to seat in one of the three depressions 240–242. As rotor 20 is rotated, the detent ball will sequentially unseat from one detent position (240 or 241 or 242) into the adjacent detent position. The above described action will cause rotational indexing of rotor 20 into three separate switching positions.

If it is desired to have a switch 10 which indexes to one position and remains there, but is returned by spring action from the switch position in the opposite direction (as for momentary contact operation), a ramp 250 may be inserted into the appropriate detent depression 240–242. The ramp 250 provides a return action similar to that described with respect to the return spring 60 and spring plate 65 (FIGS. 2A, 3, 7A-B). In the embodiment depicted in FIGS. 9A-B, ramp 250 has been inserted into the central detent depression 241. In this position, ramp 250 will prevent detent ball 75 from seating in central detent 241. Thus, the detent ball 75 will never seat in the central detent 241 and will normally reside in either of the two other position dictated by detent depressions 240 and 242. In this embodiment, switch 10 will detent in both clockwise and counter clockwise positions but has no intermediate central position. If ramps 250 were installed in detent depressions 240 and 242, but not detent 241 (not shown), the ramps 250 will act to return the switch 10 to a normal, center position after the knob 25 is released. This provides a similar switching action to that described in connection with the embodiment of FIG. 7A.

The ramps eliminate the detent action, so that the return spring 60 or 60' can perform its function. Although detent ball 75 will not seat in any of the detent depressions 240-242 in which a ramp 250 is installed, the electrical connections between the stationary contacts 150-153 and the floating contacts 70-71 which correspond to the switch position will still occur. With the ramp 250 installed, the user of the switch 10 would have to hold switch knob 25 in position in order to maintain the electrical connection at that switch position.

The shaft central portion 21 further includes a recess 21d diametrically opposite the detent portion 21c (see FIG. 2A). When the switch 10 is assembled, a stop finger 55 (depending from the interior of the top of terminal base 50) extends into recess 21d. The finger 55 is shown in its operational position in recess 21d in FIG. 9A. The finger 55 acts as a stop when the rotation of the rotor 20 causes the wall of the recess 21d to abut stationary finger 55. This prevents over rotation of rotor 20 in either direction and potential damage to the switch, where the action of detent ball 75 and detent depressions 240-242 may not be enough to prevent over rotation. The abutment of the finger 55 and the wall of the recess 21d will also determine the final angular position of the rotor 20. In the preferred embodiment of the present invention, the two outside detent depressions 240, 242 and the wall of the recess 21d (and/or the width of finger 55) are configured such that when the detent ball 75 is seated in the detent depression (240 or 242), the finger 55 just abuts a wall of recess 21d, and rotor 20 has been rotated 45 degrees away from the center position.

Figure 9B:
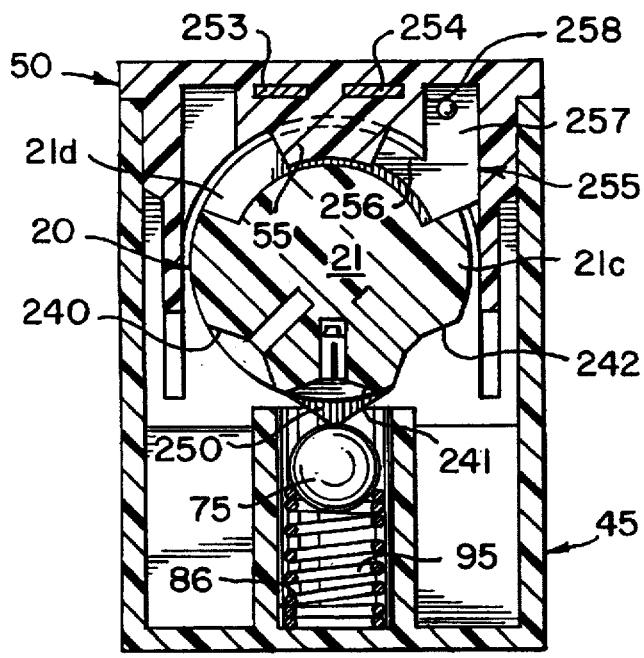
FIG. 9B is a transverse cross-sectional view of a modification of the switch of FIG. 3, taken along line 9B—9B.
Figure 9C:
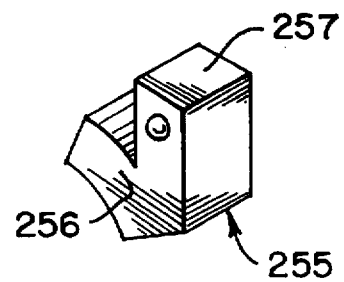
FIG. 9C is a perspective view of the stop piece of FIG. 9B.

Normally, switch 10 may be rotated about 45 degrees in each direction from a center position (which may be, for example, an "OFF" position). The 45-degree rotation in each direction is limited by the finger 55 and recess 21d arrangement discussed above. Many switches, though, only need to rotated between two positions (as in a simple Off-On switch). In order to keep the number of different switch components to a minimum, the limitation to the 45-degree rotation does not have to be accomplished by providing different rotors or bases but rather is enabled by installing a stop piece 255 into recess 21d in the terminal base 50. As seen in FIG. 9B, stop piece 255 will prevent a clockwise rotation of rotor 20 ,viewed from the front end. The stop piece 255 may instead be installed in recess 258' to inhibit excessive rotation in the opposite direction. FIG. 9C depicts stop piece 225 in an uninstalled state. The lower portion 256 of stop piece 255, which extends into recess 21d, is curved to match the curvature of inner portion of recess 21d. Upper portion 257 of stop piece 255 is substantially rectangular in order to engage a rectangular recess 258 in terminal base 50.

FIG. 10 is a cross-section of the switch 10 of FIG. 3 taken along line 10—10, illustrating the illuminated indicator module 40, as viewed from the rear. The rotor 20 passes though rotor bushing 15 which is engaged with illumination module bushing 116 by keys 117 and slots 17 and 18. Supports 320a and 320b are formed as part of the front piece 115 and serve to retain a light distributor 135 in its proper position.

Lamp 120 in the assembled module 40 resides in the open end of the horseshoe shaped light distributor 135. Light travels up the distributor 135 uninterrupted along the two distribution legs until the light reaches reflecting interfaces 300, 302, 305 and 310 as seen in FIG. 12. These reflecting surfaces 300, 302, 305 and 310 act to redirect the light out of the module 40 through holes 125. There is no hole corresponding to reflector 302, as this reflector has been included in this Figure to illustrate an alternative embodiment of the module in which switch 10 would have four different switch positions, and an additional through hole is formed in the front piece 115 (not shown) corresponding to the prism 302. The nature of these reflecting surface is discussed in connection with FIG. 12.

FIG. 11 illustrates a cross-sectional front view of the illuminated indicator module 40 taken along line 11—11 in FIG. 3. In this Figure, the electrical connections of the lamp 120 are more clearly shown. The two lamp leads 122 are bent around respective posts 123 which project from the back piece 110. During assembly of the module 40, positive electrical connection of the terminal portions 41a, 42a is made with leads 122 when the two terminals 41 and 42 are placed in their operative position in the back piece 110. The terminals 41, 42 extend out of the module 40 (see FIG. 1) and enable connection to an external power source (not shown) for supplying power to the lamp 120.

FIG. 11A is a fragmentary cross-sectional view of the connection of terminal 42 and lead 122 taken along line 11A—11A in FIG. 11. As seen in this figure, portion 42a electrically connects to lead 122 while the remainder of terminal 42 is seen extending out of the indicator module 40 for connection to an external power source (not shown).

FIG. 12 is an enlarged fragmentary cross-sectional view of light distributor 135 taken along line 12—12 of FIG. 10. This cross-sectional view has been unrolled or "flattened" in order to illustrate the structure of the reflectors 300, 302, 305 and 310. As flight travels up the material of the distributor 135 (e.g. from the left in FIG. 12), it will strike the angular notches (302a for example) of the interface 302. The angles of these notches are such (preferably 45° to the direction of flight flow) that some flight will be reflected in a direction normal to the inner surface of distributor 135, and out of the corresponding hole 125, passing through its filter 130. The remainder of the flight passes upwardly to surface 300, where similar action takes place, projecting flight through another hole 125 and filter 130. Light coming upward along the other leg of distributor 135 (e.g. from the right in FIG. 12) will similarly be projected by surface 305 outwardly through another hole 125 and filter 130. As the flight reaches the apex of the horseshoe shaped distributor 135, it will encounter the triangular shaped notch 310 defined by slanted surfaces 310a and 310b. As with the other surfaces 300-305, light will be reflected off of these surfaces 310a, 310b and directed out the hole 125 in registry with notch 310. Thus the switch position is indicated by which of the apertures 125 is in registry with knob element 30.

The described arrangement thus provides an illuminated indicator module usable with any rotary switch, and cooperative with illumination apertures 125 in the supporting panel.

The connection of knob 25 to the switch 10 can be seen in FIG. 13. This Figure is a cross-sectional view of knob 25 taken along line 13—13 of FIG. 3. As seen in this Figure, the octagonal shaped proximal end 23 of the rotor is engaged in a correspondingly shaped recess in the knob 25. The unthreaded neck portion 16 of rotor bushing 15 is surrounded by the tubular elastomeric seal 26. The seal 26 is used to create a seal between the knob 25 and the neck portion 16. The transparent or translucent element 30 is shown incorporated into the knob 25. As explained previously, element 30 serves as part of the illumination system of the switch 110 in order provide the user of the switch with an illuminated visual indication of the switch position which is defined by the following claims.

Having thus described a preferred embodiment of the present invention, it is to be understood that the above described device is merely illustrative of the principles of the present invention, and that other devices may be devised by those skilled in the art without departing from the spirit and scope of the invention.

We claim:

1. A terminal lead frame for use in a selectively configurable switching device having a movable switching element, said terminal lead frame comprising:

a terminal base;

a terminal lead frame mated with said terminal base, said terminal lead frame including:

first, second, third, and fourth internal contacts, each said internal contact being configured to selectively contact said movable switching element in said housing to provide differing switching configurations for said switching device;

a first internal connecting strap electrically connecting said first and second internal contacts;

a second internal connecting strap electrically connecting said third and fourth internal contacts;

first, second, third, and fourth external terminals;

a first external connecting strap electrically connecting said first and second external terminals;

a second external connecting strap electrically connecting said third and fourth external terminals;

said first, second, third and fourth internal contacts being respectively connected to said first, second, third and fourth external terminals;

at least one of said first internal connecting strap, second internal connecting strap, first external connecting strap and second external connecting strap being removable prior to mating with said terminal base; and said terminal lead frame being bent in order to mate with said terminal base.

2. A terminal lead frame according to claim 1, wherein said terminal lead frame blank further includes:

a selectively removable third internal connecting strap electrically connecting said second and said third internal contacts; and a selectively removable third external connecting strap electrically connecting said second and said third external terminals.

3. A terminal lead frame according to claim 1, wherein said terminal lead frame further includes:

a single coplanar conductive metal sheet forming all of said internal contacts, said external terminals and said connecting straps;

said first and second internal contacts are in a first plane perpendicular to said plane of said conductive metal sheet;

said third and fourth internal contacts are in a second plane perpendicular to said plane of said conductive metal sheet;

said first and second planes are parallel;

said first and second external terminals are in a third plane perpendicular to said plane of said conductive metal sheet;

said third and fourth external terminals are in a fourth plane perpendicular to said plane of said conductive metal sheet; and said third and fourth planes are parallel.

4. A terminal lead frame according to claim 3 wherein said lead frame is partially encased in plastic.

5. A terminal lead frame as in any of claims 1, 2 or 3 wherein said terminals are selectively removable to provide differing output configurations for use with said switching device.

* * * * *